(12) United States Patent
Sommer et al.

(10) Patent No.: US 9,053,047 B2
(45) Date of Patent: Jun. 9, 2015

(54) PARAMETER ESTIMATION USING PARTIAL ECC DECODING

(75) Inventors: Naftali Sommer, Rishon Le-Zion (IL); Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 199 days.

(21) Appl. No.: 13/595,669

(22) Filed: Aug. 27, 2012

(65) Prior Publication Data

US 2014/0059403 A1    Feb. 27, 2014

(51) Int. Cl.
| | |
|---|---|
| H03M 13/00 | (2006.01) |
| G06F 11/00 | (2006.01) |
| G06F 11/10 | (2006.01) |
| H03M 13/11 | (2006.01) |
| H03M 13/15 | (2006.01) |
| H03M 13/19 | (2006.01) |
| H03M 13/23 | (2006.01) |
| H03M 13/29 | (2006.01) |

(52) U.S. Cl.
CPC ....... *G06F 11/1012* (2013.01); *H03M 13/1174* (2013.01); *H03M 13/1515* (2013.01); *H03M 13/152* (2013.01); *H03M 13/19* (2013.01); *H03M 13/23* (2013.01); *H03M 13/2909* (2013.01); *H03M 13/2957* (2013.01); *H03M 13/6337* (2013.01)

(58) Field of Classification Search
CPC .......... G06F 11/1012; H03M 13/6337; H03M 13/1174; H03M 13/1515

USPC ................ 714/746, 780, 782, 784, 755, 786, 714/800–801

See application file for complete search history.

(56) References Cited

U.S. PATENT DOCUMENTS

| | | | | |
|---|---|---|---|---|
| 5,721,745 | A * | 2/1998 | Hladik et al. | 714/755 |
| 6,000,054 | A | 12/1999 | Bahr et al. | |
| 6,715,120 | B1 * | 3/2004 | Hladik et al. | 714/755 |
| 7,370,258 | B2 * | 5/2008 | Iancu et al. | 714/755 |
| 7,962,831 | B2 | 6/2011 | Park et al. | |
| 8,065,583 | B2 | 11/2011 | Radke | |
| 8,156,403 | B2 | 4/2012 | Shalvi et al. | |
| 8,510,639 | B2 * | 8/2013 | Steiner et al. | 714/774 |
| 2010/0299575 | A1 | 11/2010 | Roth et al. | |

\* cited by examiner

*Primary Examiner* — Shelly A Chase
(74) *Attorney, Agent, or Firm* — Myertons, Hood, Kivlin, Kowert & Goetzel, P.C.

(57) ABSTRACT

In some embodiments, a method includes accepting a code word of a composite Error Correction Code (ECC), which was produced by encoding data with multiple component ECCs, and which was received with one or more reception parameters. One or more of the component ECCs are decoded, but without fully decoding the code word. The one or more reception parameters are estimated based on the decoded component ECCs. In other embodiments, a method includes accepting a code word of an ECC, which encodes data and which was received with one or more reception parameters. An Error Locator Polynomial (ELP), having one or more roots that indicate respective locations of one or more errors in the code word, is derived from the accepted code word. The one or more reception parameters are estimated based on the ELP.

32 Claims, 3 Drawing Sheets

PARAMETER ESTIMATION USING PARTIAL ECC DECODING

FIELD OF THE INVENTION

The present invention relates generally to Error Correction Coding (ECC), and particularly to methods and systems for parameter estimation in ECC applications.

BACKGROUND OF THE INVENTION

Error Correction Coding (ECC) is used in various applications, such as in communication systems and data storage systems. The ECC is sometimes used for parameter estimation. For example, U.S. Pat. No. 8,156,398, whose disclosure is incorporated herein by reference, describes a method for operating a memory that includes analog memory cells. the method includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

SUMMARY OF THE INVENTION

An embodiment of the present invention that is described herein provides a method including accepting a code word of a composite Error Correction Code (ECC). The code word was produced by encoding data with multiple component ECCs, and was received with one or more reception parameters. One or more of the component ECCs are decoded, but without fully decoding the code word. The one or more reception parameters are estimated based on the decoded component ECCs.

In some embodiments, the composite ECC includes a product code in which the data is arranged in a matrix and each component ECC encodes a respective row or column of the matrix, and decoding the component ECCs includes decoding the component ECCs for at least one of the rows or columns.

In another embodiment, the composite ECC includes a Turbo code in which an interleaved copy of the data is encoded to produce a first component ECC, and a non-interleaved version of the data is encoded to produce a second component ECC, and decoding the component ECCs includes decoding only the second component ECC.

In yet another embodiment, the composite ECC includes a Generalized Low Density Parity Check (G-LDPC) code, which is defined by a graph including generalized check nodes that represent the component ECCs, and decoding the component ECCs includes decoding one or more of the generalized check nodes.

In some embodiments, accepting the code word includes receiving the code word from a receiver that receives the code word over a communication channel. In alternative embodiments, accepting the code word includes receiving the code word from circuitry that reads the code word from a memory. The one or more reception parameters may include one or more read thresholds used for reading the code word from the memory.

In a disclosed embodiment, the one or more reception parameters include a measure of reception quality of the code word. In an embodiment, the method includes adapting the reception parameters based on the estimated reception parameters, so as to execute subsequent reception of code words using the adapted reception parameters.

There is additionally provided, in accordance with an embodiment of the present invention, a method including accepting a code word of an ECC, which encodes data and which was received with one or more reception parameters. An Error Locator Polynomial (ELP), having one or more roots that indicate respective locations of one or more errors in the code word, is derived from the accepted code word. The one or more reception parameters are estimated based on the ELP. In some embodiments, estimating the reception parameters includes evaluating a rank of the ELP and assessing the reception parameters based on the rank.

There is also provided, in accordance with an embodiment of the present invention, apparatus including a decoder and a processor. The decoder is configured to decode code words of a composite Error Correction Code (ECC), each of which code words is produced by encoding data with multiple component ECCs. The processor is configured to control the decoder so as to decode one or more of the component ECCs of a code word of the composite ECC that was received with one or more reception parameters, but without fully decoding the code word, and to estimate the one or more reception parameters based on the decoded partial subset of the component ECCs.

There is further provided, in accordance with an embodiment of the present invention, apparatus including a decoder and a processor. The decoder is configured to decode code words of an Error Correction Code (ECC) that encode data, by deriving from the code words respective Error Locator Polynomials (ELPs) whose roots are indicative of locations of errors in the code words. The processor is configured to control the decoder so as to evaluate an ELP of a code word that was received with one or more reception parameters, and to estimate the one or more reception parameters based on the ELP.

The present invention will be more fully understood from the following detailed description of the embodiments thereof, taken together with the drawings in which:

DETAILED DESCRIPTION OF EMBODIMENTS

Overview

Figure 1:
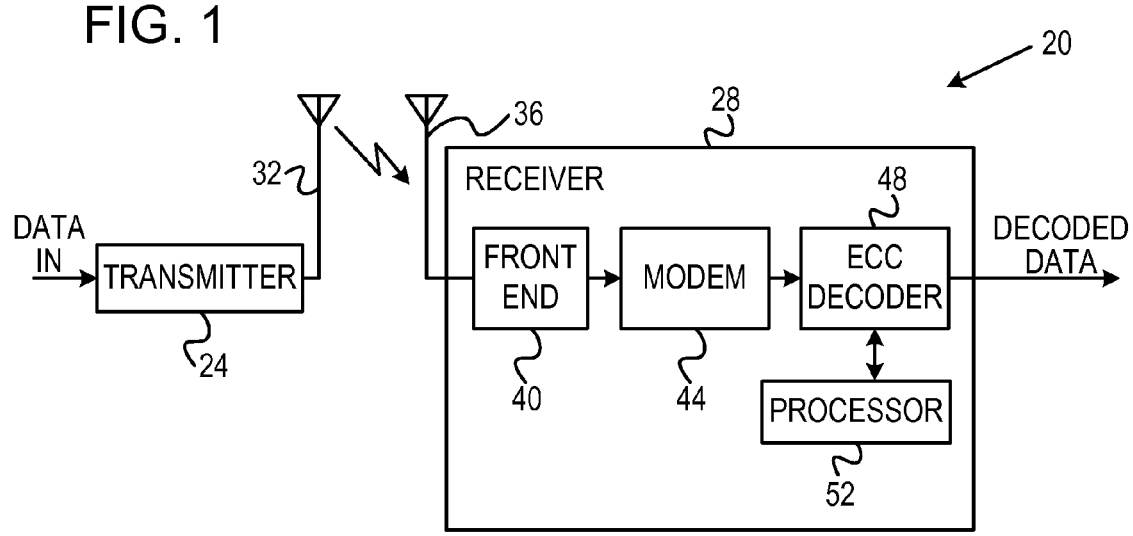
FIG. 1 is a block diagram that schematically illustrates a wireless communication system that employs ECC, in accordance with an embodiment of the present invention.

In various data storage and communication applications, code words of an Error Correction Code (ECC) are received with certain reception parameters. In a Flash memory application, for example, the reception parameters may comprise read thresholds used for reading the code word from a group of memory cells, or a Signal-to-Noise Ratio (SNR) or Bit Error Rate (BER) with which the code word is read from memory. In a communication application, the reception parameters may comprise, for example, a timing or phase offset with which a communication signal carrying the code word is received, as well as SNR or BER.

Embodiments of the present invention that are described herein provide improved methods and systems for estimating such reception parameters. The disclosed techniques estimate the reception parameters based on the ECC properties, or the effects of the ECC on the encoded data, but without fully decoding the ECC.

In some embodiments, the ECC in question is a composite ECC in which each code word is produced by encoding data with multiple component ECCs. In these embodiments, the reception parameters are estimated by decoding one or more of the component codes, but without fully decoding the entire code word.

In a product code, for example, a code word is produced by arranging data in a matrix, and encoding each row and each column of the matrix with the component ECC. The reception parameters are estimated by decoding at least one of the rows and/or columns, and counting the total number of detected or corrected errors. In an embodiment, only a partial subset of the component ECCs is decoded, for example only the matrix rows.

As another example, in a Turbo code, a code word is formed from an interleaved version and a non-interleaved version of the data, each encoded with a convolutional component code. The reception parameters may be estimated by decoding the convolutional code only for the non-interleaved version of the data.

In alternative embodiments, the ECC decoding process involves calculating syndromes for the code word, and processing the syndromes to produce an Error Locator Polynomial (ELP) whose roots are indicative of error locations in the code word. The ELP roots are then found and used for correcting the errors. Types of ECC that can be decoded in this manner comprise, for example, Bose-Chaudhuri-Hocquenghem (BCH) codes and Reed-Solomon (RS) codes. In some embodiments, the reception parameters are estimated from the rank of the ELP, regardless of whether the ELP roots are later found or not.

As noted above, the disclosed techniques exploit the ECC properties and/or parts of the decoding process, but do not rely on full decoding of the code word. As such, these techniques estimate the reception parameters with modest computational complexity and small latency. This property is important, for example, when searching over multiple values of the reception parameters, e.g., when searching for an optimal setting of the memory read thresholds. The reduced latency and complexity of the disclosed techniques simplifies and shortens the search process considerably.

Moreover, some of the techniques described herein can be used for estimating the reception parameters even when the code word is not decodable due to poor reception conditions.

System Description

FIG. 1 is a block diagram that schematically illustrates a wireless communication system 20 that employs error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
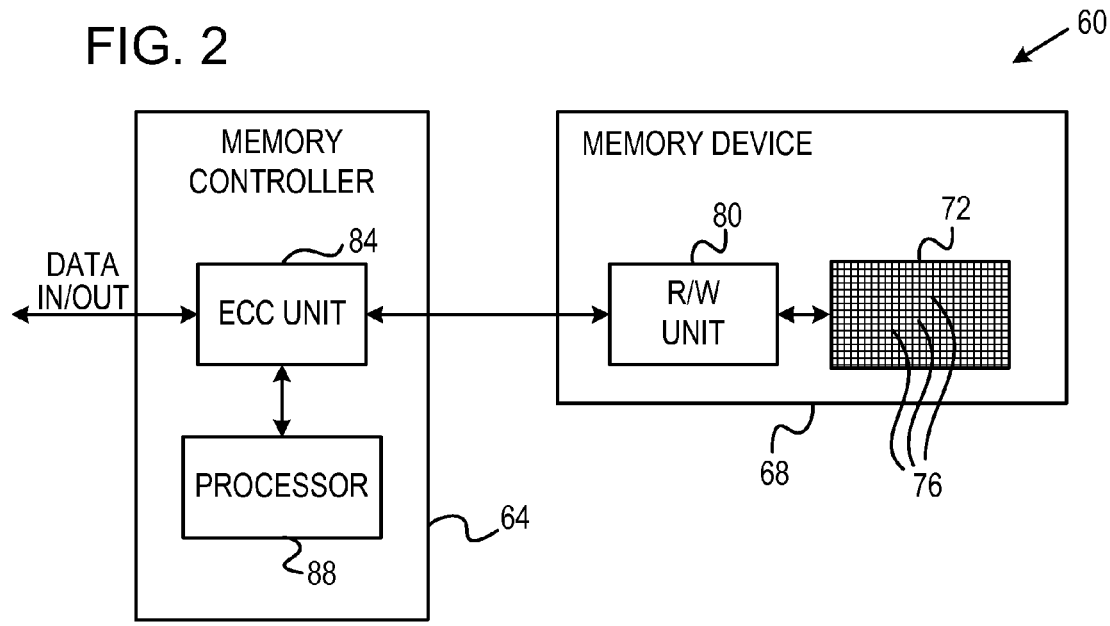
FIG. 2 is a block diagram that schematically illustrates a data storage system that employs ECC, in accordance with an embodiment of the present invention.

FIG. 2 is a block diagram that schematically illustrates a data storage system 60 that employs error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The ECC used in systems 20 and 60 may comprise, for example, a suitable BCH or Reed-Solomon (RS) code, as well as various other types of ECC.

The techniques described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

ECC decoder 48 of FIG. 1 and ECC unit 84 of FIG. 2 may be implemented in software, in hardware, or using a combination of hardware and software elements. In some embodiments, decoder 48 and/or unit 84 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48 and/or unit 84 are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements. The decoder elements other than root search units 120 are referred to as circuitry that carries out the functions described herein.

Parameter Estimation by Partial Decoding of Product Codes

Figure 3:
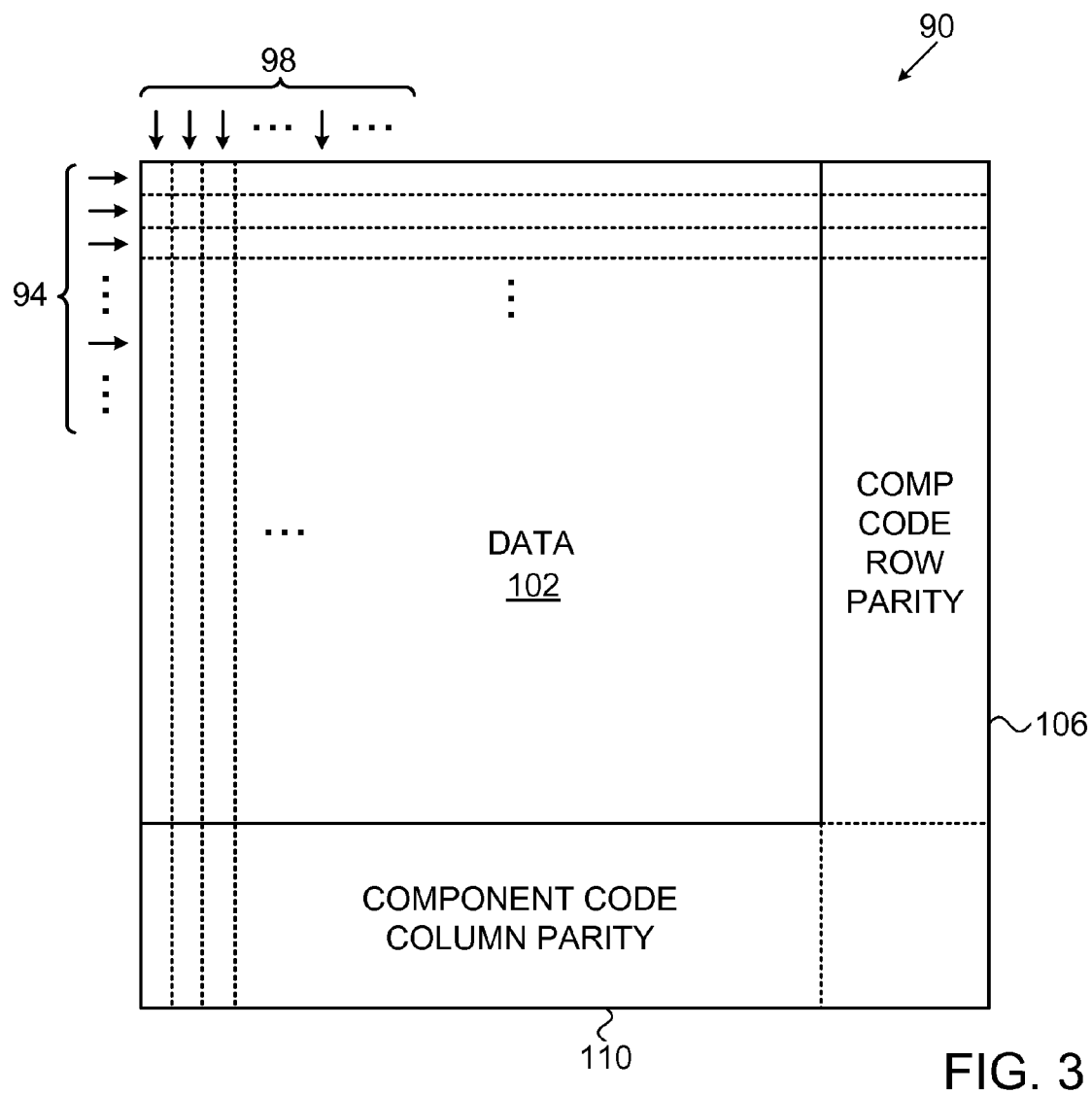
FIG. 3 is a diagram that schematically illustrates a product code comprising multiple component codes, in accordance with an embodiment of the present invention.

FIG. 3 is a diagram that schematically illustrates a code word 90 of a product code, in accordance with an embodiment of the present invention. Code word 90 is formed by arranging the data for encoding in a k-by-k data matrix 102, and then encoding each row 94 and each column 98 of the matrix with a component code whose coding rate is (n,k). Thus, the encoding process adds (n–k) parity bits to each row and each column of the k-by-k data matrix.

The component code may comprise, for example, a Hamming code, a BCH code or other suitable code. Typically, the component code is capable of correcting a relatively small number of errors (e.g., less than three errors) per row or column, and is computationally simple to decode. In an example embodiment, the component code is capable of correcting a single error, or detecting up to two errors, in each row or column.

The encoding process produces an n-by-n matrix that comprises k-by-k data matrix 102, an n-by-(n–k) row parity region 106 and an (n–k)-by-k column parity region 110. (The intersection of regions 106 and 110 at the bottom-right of the matrix comprises column parity bits that have been computed over the row parity bits, or vice versa.) The $n^2$ bits of the n-by-n matrix are regarded as a single code word of the product code.

Full decoding of code word 90 by the ECC decoder typically involves multiple iterative cycles of decoding rows 94 and then columns 98, or vice versa. In an example full decoding process, the decoder decodes the component ECCs for the rows, substitutes the decoding results in the matrix, decodes the component ECCs for the columns, substitutes the decoding results in the matrix, re-decodes the component ECCs for the rows, and so on. The decoding iterations continue, alternating between row and column decoding, until reaching some predefined stopping condition.

In some embodiments, the processor (e.g., processor 52 in system 20 or processor 88 in system 60) controls the ECC decoder (e.g., decoder 48 or ECC unit 84) to decode one or more of the component ECCs, but without fully decoding the code word. The processor estimates the reception parameters using the decoded component ECCs. In some embodiments, the decoder decodes all 2n component ECCs (n for rows 94 and n for columns 98), but does not perform substitution or iteration.

In alternative embodiments, the decoder decodes only a partial subset of the component ECCs, such as only one or more of the rows, only one or more of the columns, or any other suitable subset of the component ECCs. In an example embodiment, if the n-by-n matrix is stored in the decoder row-by-row, it may be preferable to decode the component ECCs only for rows 94 and not for columns 98. This sort of partial decoding reduces buffering requirements and latency, because the component ECC can be decoded for a given row as it is read from memory. If the matrix is stored column-by-column, it may be preferable to decode the component ECCs only for columns 98 and not for rows 94.

The processor estimates the reception parameters based on the decoded component ECCs. In an example embodiment, the processor counts the total number of errors that were detected and/or corrected by the component ECCs. This error count is useful as an indication of the reception quality or the level of distortion in the signal carrying the code word. (The term "signal" in this context refers both to analog values read from memory and to a received communication signals.) Therefore, the error count is indicative of the reception parameters.

Counting the number of errors detected and/or corrected by the component ECCs is a good estimator for the reception parameters, because for typical error rates, many of the rows and columns will be decodable. For example, for BER=1%, n=128 and an extended Hamming component ECC that corrects a single error per row or column, a typical row or column will have no more than one error, which is within the correction capability of the component ECC.

When estimating the read thresholds for a group of analog memory cells, for example, the number of errors detected and/or corrected by the component ECCs will typically be minimized at the optimal read threshold setting. Since most of the component ECCs will be decodable under these conditions, the above measure will be minimized at the optimal read threshold setting.

Moreover, in some practical scenarios the total number of (detected or corrected) errors in the component ECCs is a valid estimate even when the code word of the composite ECC is not decodable.

The processor may estimate various types of reception parameters based on the decoded component ECCs. Example reception parameters that can be estimated in this manner are given in the following table:

| Flash memory (or other analog memory) application | Communication application |
|---|---|
| Quality of read threshold setting | SNR |
| Equivalent SNR | Error rate or error probability (e.g., BER) |
| Error rate or error probability (e.g., BER) | Receiver timing error |
|  | Receiver phase error |
|  | Receiver carrier frequency error |

Figure 4:
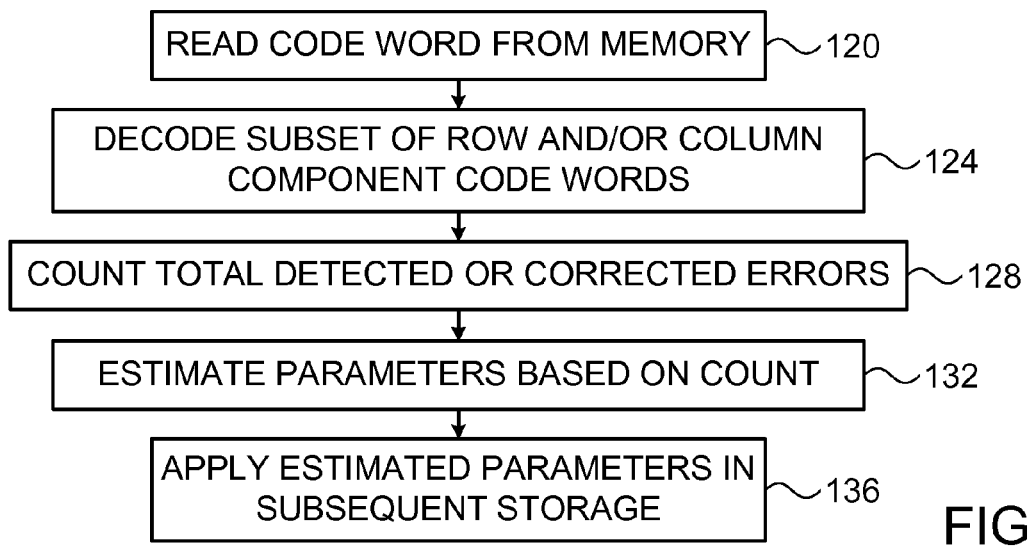
FIG. 4 is a flow chart that schematically illustrates a method for parameter estimation using a product code, in accordance with an embodiment of the present invention.

FIG. 4 is a flow chart that schematically illustrates a method for parameter estimation using a product code, in accordance with an embodiment of the present invention. The present example refers to estimating read thresholds for reading analog memory cells. Alternatively, however, this technique can be used for estimating any other suitable reception parameter in any other suitable application.

The method begins with the processor reading code word 90 of the composite ECC from a group of analog memory cells, at a readout step 120. The processor instructs the ECC decoder to decode the component ECC for one or more of rows 94 and/or columns 98, at a component ECC decoding step 124. Typically, however, the ECC decoder does not fully decode code word 90 of the composite ECC.

The processor counts the total number of detected and/or corrected errors in the decoding of the component ECCs, at an error counting step 128. The processor estimates the reception parameters based on the error count, at an estimation step 132. The processor applies the estimated parameters in subsequent storage, at a storage step 136. In the present example, the processor applies the optimal read thresholds in subsequent readout from the memory.

In some embodiments, the processor applies a search process for finding the optimal setting of the reception parameters. In an analog memory application, for example, the processor may search for the optimal setting of the read thresholds. In such a process, the processor typically reads the composite ECC code word (e.g., code word 90 of FIG. 3) using various different read threshold settings. For each setting, the processor decodes one or more of the component ECCs as described above, and evaluates the number of detected and/or corrected errors. Certain aspects of efficient read threshold search are addressed in a U.S. patent application entitled "Optimized threshold search in analog memory cells," U.S. patent application Ser. No. 13/595,571, filed Aug. 27, 2012, which is assigned to the assignee of the present patent application and whose disclosure is incorporated herein by reference.

The processor estimates the optimal read threshold setting based on the numbers of corrected and/or detected errors counted for the various read threshold settings. Generally, the processor may choose one of the settings used for reading code word 90, or compute a different setting based on the component ECC decoding results. In some embodiments the search is iterative, i.e., the processor chooses the next read threshold setting with which to read code word 90 based on the error count of the previous readout. In this manner, the iterative search process converges to the optimal read threshold setting.

The embodiments described above refer mainly to product codes that are also referred to as Turbo Product Codes (TPC). In alternative embodiments, the disclosed techniques can be used, mutatis mutandis, with various variations and generalizations of TPC. In one example generalization, a product code can be defined in more than two dimensions, such as in three dimensions. In an example three-dimensional code, data is arranged in a cube of k·k·k bits, and every k bits in each dimension are encoded into n bits using a component code to generate an n·n·n-bit codeword. Another possible generalization in a two-dimensional product code is to encode the diagonals of the data matrix as a "virtual" $3^{rd}$ dimension, in addition to encoding the rows and columns. As yet another example, a product code can be shortened by refraining from transmitting or storing part of the data bits. Any of these examples can be regarded as a composite ECC that is made-up of component codes. Thus, the disclosed techniques can be used with all these types of codes, as well as with any other suitable code.

In another embodiment, the disclosed techniques can be used with Generalized Low Density Parity Check (G-LDPC) codes, which can also be viewed as a composite ECC that is made-up of component codes. A G-LDPC code can be described by a Tanner graph. Each check node of this graph, instead of representing a simple parity check equation, represents an ECC (such as Hamming, BCH, RS or convolutional code). A product code can be viewed as a special case of G-LDPC—the "generalized check node" in this case is a Hamming code parity check matrix, for example. The Tanner graph of such a G-LDPC code has all $n^2$ bit nodes on one side, and 2n check nodes on the opposite side. Each check node corresponds to a row or column of the matrix codeword. For example, all the bits of row 1 may be connected to a generalized check node, meaning that they are a valid Hamming codeword.

The disclosed techniques can be used with G-LDPC codes: Parameter estimation can be performed based on decoding of part of the generalized check nodes.

Parameter Estimation by Partial Decoding of Turbo Code

In alternative embodiments, the composite ECC comprises a Turbo code. In the disclosed embodiments, each code word of the Turbo code is formed by creating two versions of the input data—a time-interleaved version and a non-interleaved version. Each version of the data is encoded separately with a certain convolutional ECC, and the two encoded streams jointly form a code word of the Turbo code. The convolutional ECC used for encoding the two versions of the data is thus regarded as the component ECC.

In these embodiments, the processor estimates the reception parameters by instructing the decoder to decode only one component ECC, typically the component ECC that encodes the non-interleaved version of the data. Thus, the decoder typically does not fully decode the Turbo code at this stage. The processor estimates the reception parameters from the decoding result of this component ECC.

Figure 5:
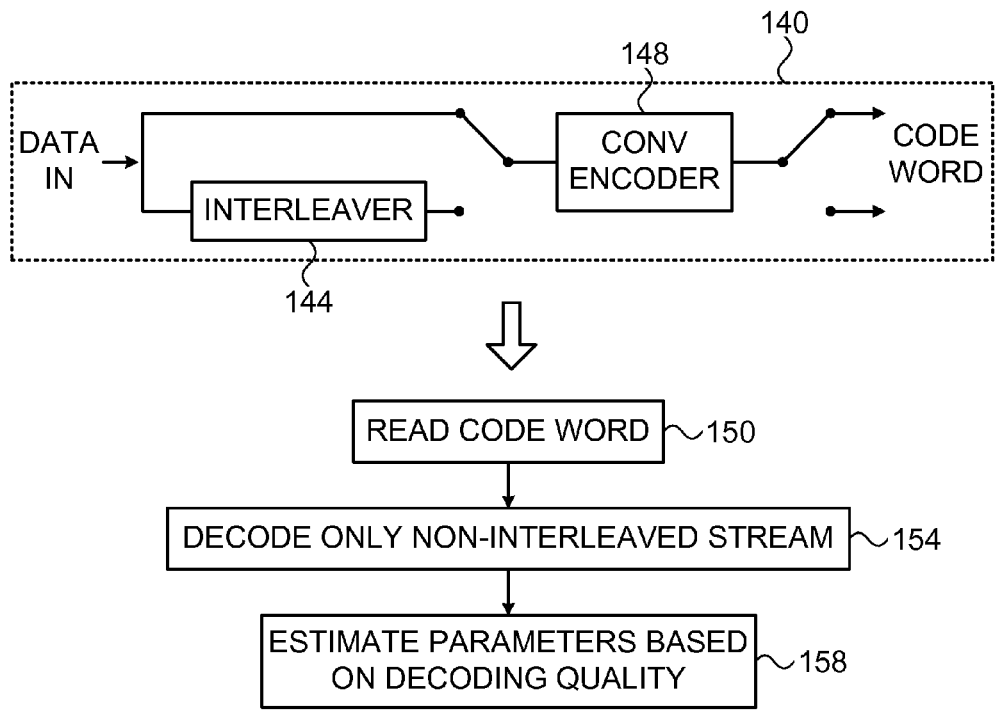
FIG. 5 is a flow chart that schematically illustrates a method for parameter estimation using a Turbo code, in accordance with an embodiment of the present invention.

FIG. 5 is a flow chart that schematically illustrates a method for parameter estimation using a Turbo code, in accordance with an embodiment of the present invention. The present example refers to a Turbo encoder 140, which comprises an interleaver 144 and a convolutional encoder 148. Interleaver 144 applies time interleaving to the data, i.e., reorders the data bits in time. Convolutional encoder 148 encodes the output of interleaver 144, and separately encodes the non-interleaved version of the data, so as to produce two respective encoded data streams. Typically, the two streams are encoded with the same convolutional code, which is regarded as the component ECC. A code word of the Turbo code (the composite ECC) is formed from these two streams.

The method of FIG. 5 begins with the processor reading a code word of the Turbo code, at an input readout step 150. The ECC decoder decodes only the component ECC corresponding to the non-interleaved version of the data, at a partial decoding step 154. The processor then estimates the reception parameters based on the decoding quality of the component ECC, at a parameter estimation step 158.

In a typical embodiment, the convolutional component ECC is decoded using the Viterbi algorithm, which optimizes a path metric. The metric can represent, for example, the squared Euclidean distance of the observations from the decoded codeword (in case of soft inputs), or the Hamming distance (in case of hard inputs). In one embodiment, the processor may compare the metric of the best path, produced by the Viterbi decoder, and choose the read thresholds that result in the best best-path-metric.

In various embodiments, the ECC decoder may estimate any suitable reception parameters (such as the parameters listed in the table above), and possibly perform any of the above-described search processes, using this technique.

Parameter Estimation by Partial Decoding of BCH Codes

In some embodiments, the ECC decoding process applied by the ECC decoder involves calculating syndromes for the code word, and processing the syndromes to produce an Error Locator Polynomial (ELP) whose roots are indicative of error locations in the code word. The ELP roots are then found and used for correcting the errors. Types of ECC that can be decoded in this manner comprise, for example, BCH codes and RS codes.

The syndromes are typically defined as Hy=S, wherein H denotes the parity check matrix of the ECC, y denotes an input code word and S denotes a vector of syndromes of code word y, denoted $S_1, S_2, S_3 \ldots$. When input code word y contains no errors, i.e., when y is a valid code word, Hy=0.

When the ECC is defined over a certain finite Galois Field (GF) having a primitive field element (also referred to as a field-generating element) $\alpha$, the $k^{th}$ syndrome $S_k$ can typically be written as $S_k=\Sigma_{i=0}^{n-1} b_i \alpha^{ki}$ (or as $S_k=\Sigma_{i=0}^{n-1} b_i \alpha^{n-1-ki}$ if the bit order is reversed), wherein $b_i$ denote the bits of the input code word. For a BCH code, coefficients $b_i$ are elements of the field GF(p), and each syndrome $S_k$ is an element of the field $GF(p^m)$. For a Reed-Solomon code, both coefficients $b_i$ and the syndromes $S_k$ are elements of the field $GF(p^m)$.

For a given set of syndromes corresponding to a given code word, the ECC decoder typically determines an ELP defined over $GF(2^m)$ whose roots are indicative of the error locations in the given code word. The ELP can be written as $ELP(x)=1+\alpha_1 x+\alpha_2 x^2+\ldots+\alpha_j x^j$, wherein j denotes the rank of the ELP, $j \leq T$. T denotes the maximum number of errors that the ECC is able to correct per code word.

The ECC decoder may apply any suitable method in order to compute the ELP for a given code word. Various schemes for generating ELPs from syndromes are known in the art, and any such scheme can be used by the ECC decoder. Some well-known schemes comprise, for example, the Berlekamp-Massey algorithm, the Euclidean algorithm and the Peterson Gorenstein Zierler algorithm. Examples of methods for determining ELPs are described, for example, by Lin and Costello in "Error Control Coding Fundamentals," Prentice Hall, second edition, 2004, chapter 6, pages 209-215, and chapter 7, pages 241-255; and by Blahut in "Algebraic Codes for Data Transmission," Cambridge University Press, 2004, chapter 6, pages 131-166, and chapter 7, pages 179-190 and 217-223, which are incorporated herein by reference.

The ECC decoder may apply any suitable method for finding the roots of the ELP. An example method for finding ELP roots, which can be used by the decoder, is described by Chien in "Cyclic Decoding Procedure for the Bose-Chaudhuri-Hocquenghem Codes," IEEE Transactions on Information Theory, vol. IT-10, October, 1964, pages 357-363, which is incorporated herein by reference. This method is commonly known as the "Chien search." Chen and Parhi describe hardware configurations that perform parallel Chien search, in "Small Area Parallel Chien Search Architectures for Long BCH Codes," IEEE Transactions on Very Large Scale Integration (VLSI) Systems, Vol. 12, No. 5, May 2004, pages 545-549, which is incorporated herein by reference.

For a given code word, the ELP roots are indicative of the locations of the errors within the code word. The ECC decoder corrects the errors at the identified locations. For a binary code such as binary BCH, the ELP roots identify the erroneous bits in the code word, and the decoder corrects the errors by reversing the values of the identified bits. In a non-binary code such as non-binary BCH or RS, on the other hand, the ELP roots indicate the erroneous symbols in the code words. In this case, the decoder determines the error values in addition to the error locations in order to correct the errors.

In many practical implementations, the syndrome calculation and ELP evaluation stages are relatively fast and computationally simple. On the other hand, locating the ELP roots (e.g., using Chien search) is often a slow and computationally intensive task. In some embodiments, the processor estimates the reception parameters (e.g., read thresholds) based on the ELP but without finding the ELP roots. In these embodiments, the processor typically instructs the decoder to compute the syndromes and evaluate the ELP, but not to find the ELP roots. The processor uses the ELP to estimate the reception parameters.

Typically, the processor assesses the rank of the ELP (i.e., the highest power in the ELP whose coefficient is non-zero), and estimates the reception parameters based on the ELP rank. Since the ELP rank is indicative of the number of errors in the code word, it can be used for estimating the reception parameters regardless of whether the error locations are later found and the errors corrected. When estimating read thresholds, for example, if the ELP rank is small (small number of errors in the code word) then the processor may deduce that the read thresholds are close to the optimal setting, and vice versa.

In various embodiments, the ECC decoder may estimate any suitable reception parameters (such as the parameters listed in the table above), and possibly perform any of the above-described search processes, using this technique. Since the search involves only syndrome computation and ELP evaluation (without finding the ELP roots and correcting the errors), the search time is reduced considerably.

Figure 6:
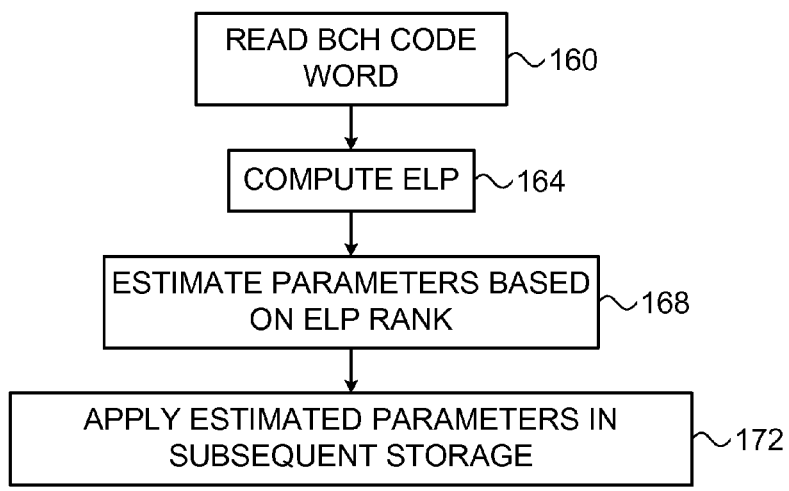
FIG. 6 is a flow chart that schematically illustrates a method for parameter estimation based on Error Locator Polynomial (ELP) evaluation, in accordance with an embodiment of the present invention.

FIG. 6 is a flow chart that schematically illustrates a method for parameter estimation based on ELP evaluation, in accordance with an embodiment of the present invention. The present example refers to a BCH code, although this technique can be used with any other suitable type of ECC. The method begins with the processor reading a BCH code word, at a code word readout step 160. The ECC decoder computes the syndromes for the code word and computes the ELP based on the syndromes, at an ELP computation step 164.

The processor estimates the reception parameters based on the ELP, typically based on the rank of the ELP, at a parameter assessment step 168. The processor applies the estimated parameters in subsequent storage, at an application step 172.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   accepting a code word of a composite Error Correction Code (ECC), which was produced by encoding data with a plurality of component ECCs, and which was received with one or more reception parameters;
   decoding a partial subset of the plurality of component ECCs without fully decoding the code word; and
   estimating the one or more reception parameters dependent upon errors detected in the partial subset of the plurality of component ECCs.

2. The method according to claim 1, wherein the composite ECC comprises a product code in which the data is arranged in a matrix and each component ECC of the plurality of component ECCs encodes a respective row or column of the matrix, and wherein the partial subset of the plurality of component ECCs corresponds to at least one of the rows or columns.

3. The method according to claim 1, wherein the composite ECC comprises a Turbo code in which an interleaved copy of the data is encoded to produce a first component ECC, and a non-interleaved version of the data is encoded to produce a second component ECC, and wherein decoding the partial subset of the plurality of component ECCs comprises decoding only the second component ECC.

4. The method according to claim 1, wherein the composite ECC comprises a Generalized Low Density Parity Check (G-LDPC) code, which is defined by a graph comprising a plurality of generalized check nodes that represent the plurality of component ECCs, and wherein decoding the partial subset of the plurality of component ECCs comprises decoding one or more of the plurality of generalized check nodes.

5. The method according to claim 1, wherein accepting the code word comprises receiving the code word from a receiver that receives the code word over a communication channel.

6. The method according to claim 1, wherein accepting the code word comprises receiving the code word from circuitry that reads the code word from a memory.

7. The method according to claim 6, wherein the one or more reception parameters comprise one or more read thresholds used for reading the code word from the memory.

8. A method, comprising:
accepting a code word of a composite Error Correction Code (ECC), which was produced by encoding data with a plurality of component ECCs, and which was received with one or more reception parameters, wherein the one or more reception parameters comprise a measure of reception quality of the code word;
decoding a partial subset of the plurality of component ECCs without fully decoding the code word; and
estimating the one or more reception parameters dependent upon errors detected in the partial subset of the plurality of component ECCs.

9. The method according to claim 1, further comprising adapting the one or more reception parameters based on the estimated one or more reception parameters, so as to execute subsequent reception of code words using the adapted one or more reception parameters.

10. A method, comprising:
accepting a code word of an Error Correction Code (ECC), which encodes data and which was received with one or more reception parameters;
deriving from the accepted code word an Error Locator Polynomial (ELP) having one or more roots that indicate respective locations of one or more errors in the code word; and
estimating the one or more reception parameters based on the ELP.

11. The method according to claim 10, wherein estimating the one or more reception parameters comprises evaluating a rank of the ELP and assessing the one or more reception parameters based on the rank.

12. The method according to claim 10, wherein accepting the code word comprises receiving the code word from a receiver that receives the code word over a communication channel.

13. The method according to claim 10, wherein accepting the code word comprises receiving the code word from circuitry that reads the code word from a memory.

14. The method according to claim 13, wherein the one or more reception parameters comprise one or more read thresholds used for reading the code word from the memory.

15. A method, comprising:
accepting a code word of an Error Correction Code (ECC), which encodes data and which was received with one or more reception parameters, wherein the one or more reception parameters comprise a measure of reception quality of the code word;
deriving from the accepted code word an Error Locator Polynomial (ELP) having one or more roots that indicate respective locations of one or more errors in the code word; and
estimating the one or more reception parameters based on the ELP.

16. The method according to claim 10, comprising adapting the one or more reception parameters based on the estimated one or more reception parameters, so as to execute subsequent reception of code words using the adapted one or more reception parameters.

17. An apparatus, comprising:
a decoder, which is configured to decode a code word of a composite Error Correction Code (ECC), wherein the code word is produced by encoding data with a plurality of component ECCs; and
a processor, which is configured to control the decoder so as to decode a proper partial subset of the plurality of component ECCs of the code word of the composite ECC that was received with one or more reception parameters, without fully decoding the code word, and to estimate the one or more reception parameters dependent upon errors detected in the partial subset of the plurality of component ECCs.

18. The apparatus according to claim 17, wherein the composite ECC comprises a product code in which the data is arranged in a matrix and each component ECC of the plurality of component ECCs encodes a respective row or column of the matrix, and wherein the processor is configured to cause the decoder to decode the partial subset of the plurality of component ECCs for at least one of the rows or columns.

19. The apparatus according to claim 17, wherein the composite ECC comprises a Turbo code in which an interleaved copy of the data is encoded to produce a first component ECC, and a non-interleaved version of the data is encoded to produce a second component ECC, and wherein the processor is configured to cause the decoder to decode only the second component ECC.

20. The apparatus according to claim 17, wherein the composite ECC comprises a Generalized Low Density Parity Check (G-LDPC) code, which is defined by a graph comprising a plurality of generalized check nodes that represent the plurality of component ECCs, and wherein the processor is configured to cause the decoder to decode one or more of the plurality of generalized check nodes.

21. The apparatus according to claim 17, wherein the code word is accepted from a receiver that receives the code word over a communication channel.

22. The apparatus according to claim 17, wherein the code word is accepted from circuitry that reads the code word from a memory.

23. The apparatus according to claim 22, wherein the one or more reception parameters comprise one or more read thresholds used for reading the code word from the memory.

24. An apparatus, comprising:
- a decoder, which is configured to decode a code word of a composite Error Correction Code (ECC), wherein the code word is produced by encoding data with a plurality of component ECCs; and
- a processor, which is configured to control the decoder so as to decode a partial subset of the plurality of component ECCs of the code word of the composite ECC that was received with one or more reception parameters, without fully decoding the code word, and to estimate the one or more reception parameters dependent upon errors detected in the partial subset of the plurality of component ECCs;
- wherein the one or more reception parameters comprise a measure of reception quality of the code word.

25. The apparatus according to claim 17, wherein the processor is further configured to adapt the one or more reception parameters based on the estimated one or more reception parameters, so as to execute subsequent reception of code words using the adapted one or more reception parameters.

26. An apparatus, comprising:
- a decoder, which is configured to decode code words of an Error Correction Code (ECC) that encode data, by deriving from the code words respective Error Locator Polynomials (ELPs) whose roots are indicative of locations of errors in the code words; and
- a processor, which is configured to control the decoder so as to evaluate an ELP of a code word that was received with one or more reception parameters, and to estimate the one or more reception parameters based on the ELP.

27. The apparatus according to claim 26, wherein the decoder is further configured to evaluate a rank of the ELP, and wherein the processor is configured to estimate the one or more reception parameters based on the rank.

28. The apparatus according to claim 26, wherein the code word is accepted from a receiver that receives the code word over a communication channel.

29. The apparatus according to claim 26, wherein the code word is accepted from circuitry that reads the code word from a memory.

30. The apparatus according to claim 29, wherein the one or more reception parameters comprise one or more read thresholds used for reading the code word from the memory.

31. An apparatus, comprising:
- a decoder, which is configured to decode code words of an Error Correction Code (ECC) that encode data, by deriving from the code words respective Error Locator Polynomials (ELPs) whose roots are indicative of locations of errors in the code words; and
- a processor, which is configured to control the decoder so as to evaluate an ELP of a code word that was received with one or more reception parameters, and to estimate the one or more reception parameters based on the ELP;
- wherein the one or more reception parameters comprise a measure of reception quality of the code word.

32. The apparatus according to claim 26, wherein the processor is further configured to adapt the one or more reception parameters based on the estimated one or more reception parameters, so as to execute subsequent reception of code words using the adapted one or more reception parameters.

* * * * *